(12) United States Patent
Park et al.

(10) Patent No.: US 9,564,411 B2
(45) Date of Patent: Feb. 7, 2017

(54) SEMICONDUCTOR PACKAGE AND METHOD OF MANUFACTURING THE SAME

(71) Applicant: NEPES CO., LTD., Eumseong-gun, Chungcheongbuk-do (KR)

(72) Inventors: Yun-Mook Park, Pyeongtaek-si (KR); Byoung-Yool Jeon, Chungcheongbuk-do (KR)

(73) Assignee: NEPES CO., LTD (KR)

( * ) Notice: Subject to any disclaimer, the term of this patent is extended or adjusted under 35 U.S.C. 154(b) by 0 days.

(21) Appl. No.: 14/369,781

(22) PCT Filed: Dec. 28, 2012

(86) PCT No.: PCT/KR2012/011767
§ 371 (c)(1),
(2) Date: Jun. 30, 2014

(87) PCT Pub. No.: WO2013/100709
PCT Pub. Date: Jul. 4, 2013

(65) Prior Publication Data
US 2014/0353823 A1    Dec. 4, 2014

(30) Foreign Application Priority Data

Dec. 29, 2011  (KR) .................. 10-2011-0145518

(51) Int. Cl.
*H01L 23/52*    (2006.01)
*H01L 23/00*    (2006.01)
(Continued)

(52) U.S. Cl.
CPC .......... *H01L 24/14* (2013.01); *H01L 21/4853* (2013.01); *H01L 21/56* (2013.01); *H01L 23/3107* (2013.01);
(Continued)

(58) Field of Classification Search
CPC .. H01L 24/14; H01L 23/5383; H01L 23/5389; H01L 23/49816; H01L 23/5384; H01L 23/3107; H01L 23/3128; H01L 2224/32225; H01L 2224/73265; H01L 2924/00; H01L 2224/48227; H01L 2924/00012; H01L 2924/15311; H01L 2924/00014; H01L 24/11; H01L 24/91; H01L 24/19
See application file for complete search history.

(56) References Cited

U.S. PATENT DOCUMENTS 8,575,493 B1 * 11/2013 Xu ..................... H01L 24/13
174/255
2006/0244120 A1 * 11/2006 Gospodinova-Daltcheva H01L 23/13
257/690
(Continued)

FOREIGN PATENT DOCUMENTS

CN         1535479 A       10/2004
JP       2003031768 A       1/2003
(Continued)

*Primary Examiner* — Trung Q Dang
*Assistant Examiner* — Wasiul Haider

(57) ABSTRACT

Disclosed herein is a semiconductor package having a fan-out structure in which a semiconductor chip is buried by an encapsulation member and an external connection member is disposed below the buried semiconductor chip. The semiconductor package includes an embedded rewiring pattern layer, an upper semiconductor chip disposed above the embedded rewiring pattern layer, an upper encapsulation member encapsulating the upper semiconductor chip, a lower semiconductor chip disposed below the embedded rewiring pattern layer, and a lower encapsulation member encapsulating the lower semiconductor chip to prevent exposure thereof.

12 Claims, 9 Drawing Sheets

(51) Int. Cl.

| | | |
|---|---|---|
| *H01L 23/31* | (2006.01) | |
| *H01L 21/56* | (2006.01) | |
| *H01L 25/03* | (2006.01) | |
| *H01L 25/00* | (2006.01) | |
| *H01L 23/498* | (2006.01) | |
| *H01L 21/48* | (2006.01) | |
| *H01L 23/538* | (2006.01) | |
| *H01L 25/065* | (2006.01) | |

(52) U.S. Cl.
CPC ..... *H01L 23/3128* (2013.01); *H01L 23/49816* (2013.01); *H01L 23/5383* (2013.01); *H01L 23/5384* (2013.01); *H01L 23/5389* (2013.01); *H01L 24/11* (2013.01); *H01L 24/19* (2013.01); *H01L 24/91* (2013.01); *H01L 25/03* (2013.01); *H01L 25/50* (2013.01); *H01L 21/568* (2013.01); *H01L 25/0657* (2013.01); *H01L 2224/0401* (2013.01); *H01L 2224/04105* (2013.01); *H01L 2224/12105* (2013.01); *H01L 2224/16225* (2013.01); *H01L 2224/16235* (2013.01); *H01L 2224/73203* (2013.01); *H01L 2224/81801* (2013.01); *H01L 2225/06517* (2013.01); *H01L 2225/06527* (2013.01); *H01L 2225/06548* (2013.01); *H01L 2924/013* (2013.01); *H01L 2924/014* (2013.01); *H01L 2924/01013* (2013.01); *H01L 2924/01029* (2013.01); *H01L 2924/14* (2013.01); *H01L 2924/1434* (2013.01); *H01L 2924/15311* (2013.01); *H01L 2924/181* (2013.01)

(56) References Cited

U.S. PATENT DOCUMENTS

| | | | |
|---|---|---|---|
| 2009/0079090 A1 | 3/2009 | Pressel et al. | |
| 2009/0140408 A1 | 6/2009 | Lee et al. | |
| 2009/0166846 A1 | 7/2009 | Pratt et al. | |
| 2010/0258937 A1 | 10/2010 | Shim et al. | |
| 2011/0068468 A1* | 3/2011 | Lin et al. | 257/737 |
| 2011/0101512 A1* | 5/2011 | Choi | H01L 23/49816 257/686 |
| 2012/0161315 A1* | 6/2012 | Lin | H01L 23/49816 257/738 |
| 2012/0217645 A1* | 8/2012 | Pagaila | 257/774 |
| 2012/0299191 A1* | 11/2012 | Camacho | 257/774 |
| 2013/0075924 A1* | 3/2013 | Lin et al. | 257/774 |
| 2015/0357320 A1* | 12/2015 | Yu | H01L 21/568 438/109 |

FOREIGN PATENT DOCUMENTS

| | | |
|---|---|---|
| KR | 20090036948 A | 4/2009 |
| KR | 100900240 B1 | 5/2009 |
| KR | 20110048733 A | 5/2011 |

* cited by examiner

SEMICONDUCTOR PACKAGE AND METHOD OF MANUFACTURING THE SAME

CROSS-REFERENCE TO RELATED APPLICATION

This application claims the benefit of Korean Patent Application No. 2011-0145518, filed on Dec. 29, 2011 in the Korean Intellectual Property Office, the disclosure of which is incorporated herein by reference.

BACKGROUND

1. Field

Embodiments of the present invention relate to a semiconductor package having a fan-out structure in which a semiconductor chip is buried by an encapsulation member and an external connection member is disposed below the buried semiconductor chip and a method of manufacturing the same.

2. Description of the Related Art

Recently, as semiconductor devices have been miniaturized and semiconductor device functions have been diversified, the size of semiconductor chips decreases and the number of input and output terminals of semiconductor chips increases, and, accordingly, electrode pad pitches have been further miniaturized. In addition, in line with acceleration of integration of various functions, there has emerged a system-level packaging technology in which a variety of devices are integrated in a single package. In addition, the system-level packaging technology has been changed to three-dimensional stacking technology in which a signal distance may be maintained short to minimize noise between operations and improve a signal rate. To control increase in product costs, increase productivity and reduce raw material costs, in addition to such demand for advances in manufacturing technology, a semiconductor package including a plurality of semiconductor chips stacked one upon another has been introduced.

In a conventional stack-type semiconductor package, for example, a system in package (SIP), input and output terminals are formed at an outer region of a second semiconductor chip stacked on a first semiconductor chip, and thus a difference between the sizes of the first and second semiconductor chips needs to be made. In addition, as such size difference decreases, the number of the input and output terminals is limited.

SUMMARY

Therefore, it is an aspect of the present invention to provide a semiconductor package having a fan-out structure in which a semiconductor chip is buried by an encapsulation member and an external connection member is disposed below the buried semiconductor chip.

It is another aspect of the present invention to provide a method of manufacturing the semiconductor package.

Additional aspects of the invention will be set forth in part in the description which follows and, in part, will be obvious from the description, or may be learned by practice of the invention.

In accordance with one aspect of the present invention, a semiconductor package includes an embedded rewiring pattern layer, an upper semiconductor chip disposed above the embedded rewiring pattern layer, an upper encapsulation member encapsulating the upper semiconductor chip, a lower semiconductor chip disposed below the embedded rewiring pattern layer, and a lower encapsulation member encapsulating the lower semiconductor chip to prevent exposure thereof.

The semiconductor package may further include a conductive post electrically connected to the embedded rewiring pattern layer and external connection members electrically connected to the conductive post.

The semiconductor package may further include an external rewiring pattern layer formed on a lower surface of the lower encapsulation member and electrically connecting the conductive post to the external connection members.

Some of the external connection members may be disposed below the lower semiconductor chip.

The upper encapsulation member and the lower encapsulation member may be connected to each other to encapsulate the embedded rewiring pattern layer to prevent exposure thereof.

The lower encapsulation member may penetrate a portion of the embedded rewiring pattern layer to be connected to the upper encapsulation member.

The upper semiconductor chip and the lower semiconductor chip may be electrically connected to each other via the embedded rewiring pattern layer.

The lower semiconductor chip may include a plurality of lower semiconductor chips.

The semiconductor package may further include a plurality of conductive posts electrically connected to the embedded rewiring pattern layer and embedded by the lower encapsulation member, the conductive posts comprising some conductive posts disposed between the lower semiconductor chips.

The upper semiconductor chip may include a plurality of upper semiconductor chips.

The upper and lower semiconductor chips may have the same size.

In accordance with another aspect of the present invention, a method of manufacturing a semiconductor package includes attaching an upper semiconductor chip to a first carrier substrate, forming an upper encapsulation member encapsulating the upper semiconductor chip, attaching a second carrier substrate to the upper encapsulation member, removing the first carrier substrate to expose the upper semiconductor chip, forming an embedded rewiring pattern layer on the exposed upper semiconductor chip and upper encapsulation member, forming a conductive post electrically connected to the embedded rewiring pattern layer, attaching a lower semiconductor chip below the embedded rewiring pattern layer in a position opposite to the upper semiconductor chip, forming a lower encapsulation member encapsulating the lower semiconductor chip and the conductive post, planarizing the lower encapsulation member to expose the conductive post, forming an external rewiring pattern layer electrically connected to the conductive post on the lower encapsulation member, and attaching an external connection member to be electrically connected to the external rewiring pattern layer.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1:
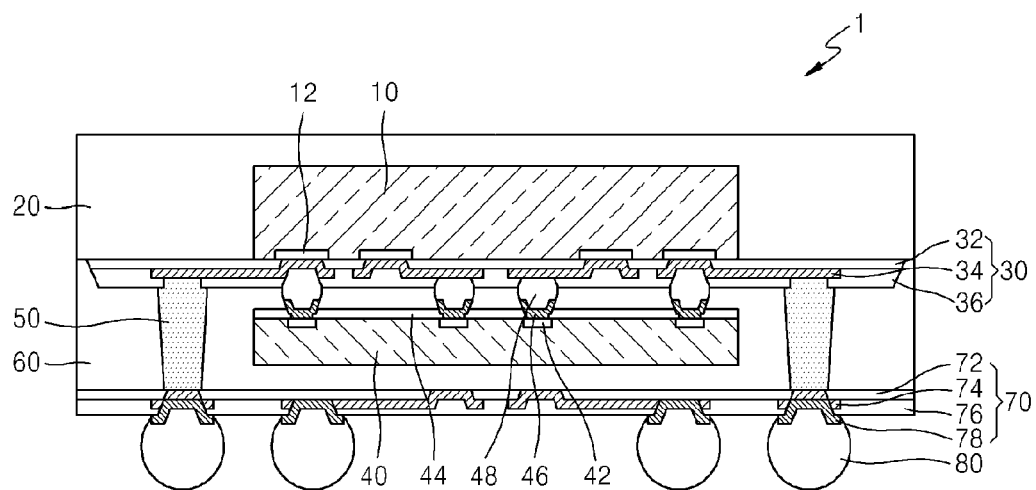
FIG. 1 is a sectional view of a semiconductor package according to an embodiment of the present invention.

Reference will now be made in detail to the embodiments of the present invention, examples of which are illustrated in the accompanying drawings. However, the present embodiments may have different forms and should not be construed as being limited to the descriptions set forth herein. Rather, these embodiments are provided so that this disclosure will be thorough and complete, and will fully convey the scope of the invention to those skilled in the art. As used herein, the term "and/or" includes any and all combinations of one or more of the associated listed items. In this regard, like reference numerals refer to like elements throughout. Further, a variety of elements and regions in the drawings are schematically illustrated. Thus, the invention is not limited to the relative sizes or intervals shown in the accompanying drawings.

FIG. 1 is a sectional view of a semiconductor package 1 according to an embodiment of the present invention.

Referring to FIG. 1, the semiconductor package 1 includes an embedded rewiring pattern layer 30 and upper and lower semiconductor chips 10 and 40 disposed at opposite sides of the embedded rewiring pattern layer 30. For example, the upper semiconductor chip 10 may be disposed above the embedded rewiring pattern layer 30 and the lower semiconductor chip 40 may be disposed below the embedded rewiring pattern layer 30. The semiconductor package 1 may also include an upper encapsulation member 20 encapsulating the upper semiconductor chip 10 and a lower encapsulation member 60 encapsulating the lower semiconductor chip 40. The semiconductor package 1 may further include conductive posts 50 electrically connected to the embedded rewiring pattern layer 30, an external rewiring pattern layer 70 electrically connected to the conductive posts 50, and external connection members 80.

Materials constituting the upper and lower semiconductor chips 10 and 40 may be the same or different. For example, the upper and lower semiconductor chips 10 and 40 may be a memory chip or a logic chip. Examples of the memory chip include DRAM, SRAM, flash, PRAM, ReRAM, FeRAM, and MRAM. The logic chip may be a controller controlling memory chips. For example, the upper semiconductor chip 10 may be a logic chip including a logic circuit and the lower semiconductor chip 40 may be a memory chip, or vice versa. The semiconductor package 1 may be a system on chip (SOC) or a system in package (SIP).

The upper and lower semiconductor chips 10 and 40 may have the same size or different sizes.

The upper semiconductor chip 10 may include upper semiconductor chip pads 12, and the lower semiconductor chip 40 may include lower semiconductor chip pads 42. In addition, an insulating layer 44 and a bonding pad 46 connected to each lower semiconductor chip pad 42 may be disposed on the lower semiconductor chip 40.

The embedded rewiring pattern layer 30 may include a first insulating layer 32, rewiring patterns 34, and a second insulating layer 36. The rewiring patterns 34 may include a conductive material, e.g., a metal such as Cu, a Cu alloy, Al, or an Al alloy. The upper semiconductor chip 10 and/or the lower semiconductor chip 40 may be rewired by the rewiring patterns 34 and electrically connected to the external connection members 80. Accordingly, input and output terminals of the upper semiconductor chip 10 and/or the lower semiconductor chip 40 may be reduced in size, and the number of the input and output terminals may be increased. In addition, the upper semiconductor chip 10 and/or the lower semiconductor chip 40 may be connected to the embedded rewiring pattern layer 30. As such, the semiconductor package 1 may have a fan-out structure. The upper and lower semiconductor chips 10 and 40 may share the rewiring patterns 34. In this case, the upper and lower semiconductor chips 10 and 40 may be electrically connected to each other via the rewiring patterns 34. Alternatively, the upper and lower semiconductor chips 10 and 40 may be connected to the respective rewiring patterns 34 electrically insulated from each other. In this case, the upper and lower semiconductor chips 10 and 40 may not be electrically connected to each other via the rewiring patterns 34.

The first insulating layer 32 may be formed to cover upper portions of the rewiring patterns 34, and the second insulating layer 36 may be formed to cover lower portions of the rewiring patterns 34. Upper surfaces of the rewiring patterns 34 may be partially exposed through the first insulating layer 32, and the partially exposed rewiring patterns 34 may be electrically connected to the upper semiconductor chip 10. That is, the rewiring patterns 34 and the upper semiconductor chip pads 12 of the upper semiconductor chip 10 may be electrically connected to each other. In addition, lower surfaces of the rewiring patterns 34 may be partially exposed via the second insulating layer 36, and the exposed lower surface portions of the rewiring pattern 34 may be electrically connected to the lower semiconductor chip 40. The rewiring patterns 34 may be formed as a single layer or multiple layers of the rewiring patterns 34 may be formed.

A previously manufactured substrate may be used as the embedded rewiring pattern layer 30. In some embodiments, the embedded rewiring pattern layer 30 may be adhered to the upper semiconductor chip 10 and the upper encapsulation member 20 by pressing, adhesion, or a reflow process.

The connection members 48 may be disposed on the respective bonding pads 46 and the respective exposed surface portions of the rewiring patterns 34 of the embedded rewiring pattern layer 30, and may be electrically connected to the rewiring patterns 34 of the embedded rewiring pattern layer 30 and the lower semiconductor chip pads 42 of the lower semiconductor chip 40. In addition, the upper and lower semiconductor chips 10 and 40 may be electrically connected to each other via the embedded rewiring pattern layer 30 and the connection members 48. The connection members 48 may include a conductive material, for example, a metal. The connection members 48 may be, for example, solder balls and may be attached to the bonding pads 46 and the embedded rewiring pattern layer 30 through a reflow process.

The upper encapsulation member 20 may encapsulate the upper semiconductor chip 10. The upper encapsulation member 20 may completely cover the upper semiconductor chip 10. Alternatively, an upper surface of the upper semiconductor chip 10 may be exposed via the upper encapsulation member 20. The upper encapsulation member 20 may include an insulating material, for example, an epoxy molding compound (EMC).

The conductive posts 50 may be electrically connected to the embedded rewiring pattern layer 30. Each conductive post 50 may be disposed on an exposed portion of the embedded rewiring pattern layer 30, and the conductive post 50 may be electrically connected to the embedded rewiring pattern layer 30. The conductive posts 50 may be disposed at the side of the lower semiconductor chip 40. Also, the upper semiconductor chip 10 may extend toward regions above the conductive posts 50. The height of the conductive post 50 from the embedded rewiring pattern layer 30 may be greater than that of the lower semiconductor chip 40. The conductive posts 50 may include a conductive material, e.g., a metal such as Cu, a Cu alloy, Al, or an Al alloy. Also, the conductive posts 50 may include conductive solder or a solder paste including a conductive material. Alternatively, the conductive posts 50 may be through electrodes such as through silicon vias (TSVs).

The lower encapsulation member 60 may encapsulate the lower semiconductor chip 40 and the conductive posts 50. The lower encapsulation member 60 may encapsulate the lower semiconductor chip 40 to prevent exposure thereof. In addition, the lower encapsulation member 60 may encapsulate the embedded rewiring pattern layer 30. The lower encapsulation member 60 may fill a space between the connection members 48 of the lower semiconductor chip 40. The lower encapsulation member 60 may include an insulating material, for example, EMC.

The upper and lower encapsulation members 20 and 60 may be connected to each other and may encapsulate the embedded rewiring pattern layer 30 to prevent exposure thereof. Alternatively, the embedded rewiring pattern layer 30 may be exposed via the upper encapsulation member 20 and/or the lower encapsulation member 60. The upper and lower encapsulation members 20 and 60 may include the same material or different materials. The upper and lower encapsulation members 20 and 60 may form a unibody structure.

The height of the conductive posts 50 from the embedded rewiring pattern layer 30 may be greater than that of the lower semiconductor chip 40, and thus the lower semiconductor chip 40 may be embedded by the lower encapsulation member 60 to prevent exposure thereof.

The external rewiring pattern layer 70 may be disposed on a lower side of the lower encapsulation member 60 and be electrically connected to the conductive posts 50. The external rewiring pattern layer 70 may electrically connect the conductive posts 50 to the external connection members 80. In addition, the upper semiconductor chip 10 and/or the lower semiconductor chip 40 may be connected to the external rewiring pattern layer 70, and, as such, the semiconductor package 1 may have a fan-out structure.

The external rewiring pattern layer 70 may include a third insulating layer 72, external rewiring patterns 74, a fourth insulating layer 76, and external bonding pads 78. The external rewiring patterns 74 may include a conductive material, for example, a metal such as Cu, a Cu alloy, Al, or an Al alloy. Upper parts of the external rewiring patterns 74 may be covered by the third insulating layer 72, and lower parts of the external rewiring patterns 74 may be covered by the fourth insulating layer 76. The upper parts of the external rewiring patterns 74 may be partially exposed via the third insulating layer 72, and the partially exposed upper parts of the external rewiring patterns 74 may be electrically connected to the conductive posts 50. That is, the external rewiring patterns 74 and the embedded rewiring pattern layer 30 may be electrically connected to each other. Also, lower parts of the external rewiring patterns 74 may be partially exposed via the fourth insulating layer 76, and the partially exposed lower parts of the external rewiring patterns 74 may be electrically connected to the external connection members 80. External bonding pads 78 may be further formed on the exposed portions of the external rewiring patterns 74. The external rewiring pattern layer 70 may be a previously manufactured substrate, and may be adhered to the conductive posts 50 and the lower encapsulation member 60 by pressing, adhesion, or a reflow process.

The external connection members 80 may be disposed in electrical connection with the external rewiring pattern layer 70. The external connection members 80 may be attached to the exposed portions of the external rewiring patterns 74 or the external bonding pads 78. The external connection members 80 may include a conductive material, for example, a metal. The external connection members 80 may be solder balls.

The external rewiring pattern layer 70 may provide rewiring, and, accordingly, some of the external connection members 80 may be disposed below the lower semiconductor chip 40. Thus, the external connection members 80 may be arranged over a relatively wide range of areas. Consequently, the input and output terminals of the upper semiconductor chip 10 and/or the lower semiconductor chip 40 may be miniaturized, and the number of the input and output terminals may be increased.

FIGS. 2 through 8 illustrate semiconductor packages 2, 3, 4, 5, 6, 7 and 8 according to embodiments of the present invention. The semiconductor packages 2, 3, 4, 5, 6, 7 and 8 according to the present embodiments have a structure in which some elements are modified from those of the semiconductor package 1 illustrated in FIG. 1, and thus a detailed description thereof is not provided here.

Figure 2:
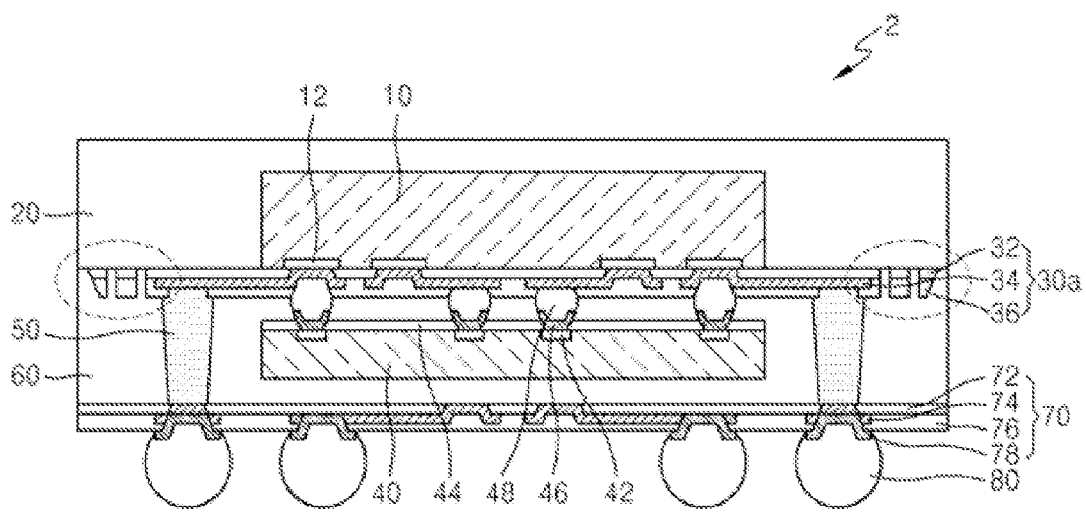
FIGS. 2 through 8 are sectional views of semiconductor packages according to embodiments of the present invention.

Referring to FIG. 2, the upper encapsulation member 20 and the lower encapsulation member 60 are connected to each other to encapsulate an embedded rewiring pattern layer 30a to prevent exposure thereof. In addition, the lower encapsulation member 60 may penetrate a portion of the embedded rewiring pattern layer 30a and thus is more closely connected to the upper encapsulation member 20. Accordingly, an adhesive strength between the upper and lower encapsulation members 20 and 60 may be further increased.

Figure 3:
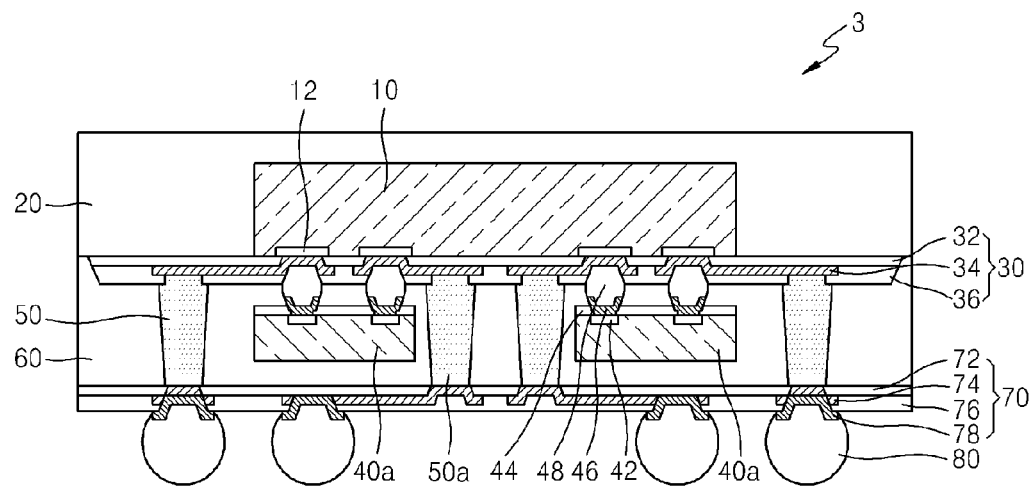

Referring to FIG. 3, the semiconductor package 3 may include a plurality of lower semiconductor chips 40a. The lower semiconductor chips 40a may be electrically connected to the embedded rewiring pattern layer 30, similarly to the lower semiconductor chip 40 of FIG. 1. Conductive posts 50a may be disposed between the lower semiconductor chips 40a, and the conductive posts 50a may be electrically connected to the embedded rewiring pattern layer 30.

Figure 4:
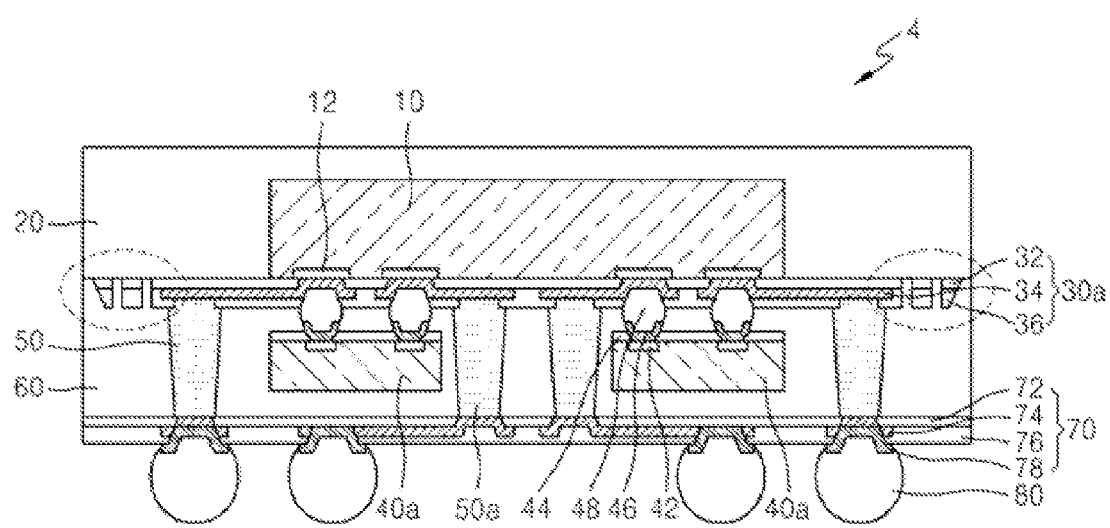

Referring to FIG. 4, the semiconductor package 4 may include a plurality of lower semiconductor chips 40a. The lower semiconductor chips 40a may be electrically connected to an embedded rewiring pattern layer 30a, similarly to the lower semiconductor chip 40 of FIG. 1. Conductive posts 50a may be disposed between the lower semiconductor chips 40a, and the conductive posts 50a may be electrically connected to the embedded rewiring pattern layer 30a. In addition, the upper encapsulation member 20 and the lower encapsulation member 60 may be connected to each other to encapsulate the embedded rewiring pattern layer 30a to prevent exposure thereof. In addition, the lower encapsulation member 60 may penetrate a portion of the embedded rewiring pattern layer 30a and thus is more closely connected to the upper encapsulation member 20. Accordingly, an adhesive strength between the upper and lower encapsulation members 20 and 60 may be further increased.

Figure 5:
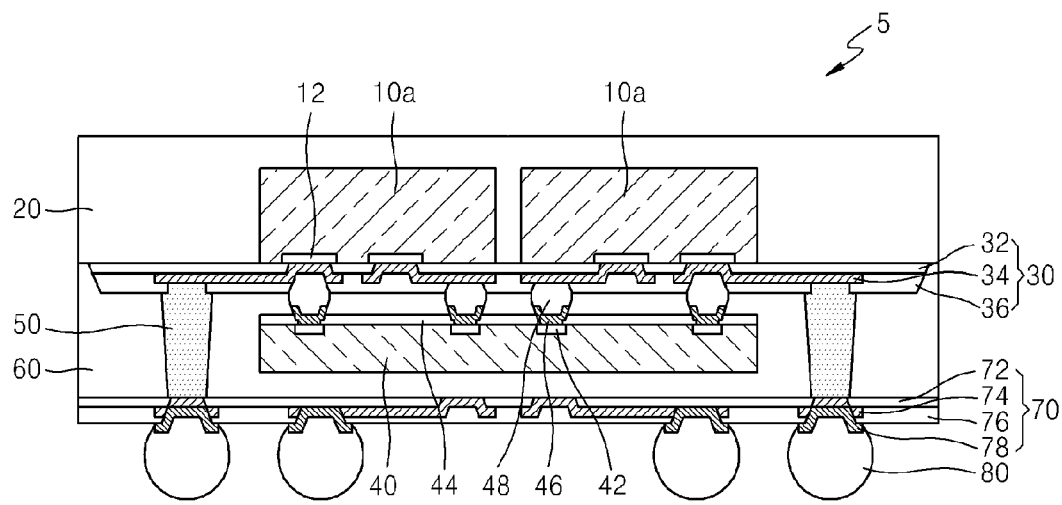

Referring to FIG. 5, the semiconductor package 5 may include a plurality of upper semiconductor chips 10a. The upper semiconductor chips 10a may be electrically connected to the embedded rewiring pattern layer 30, similarly to the upper semiconductor chip 10 of FIG. 1.

Figure 6:
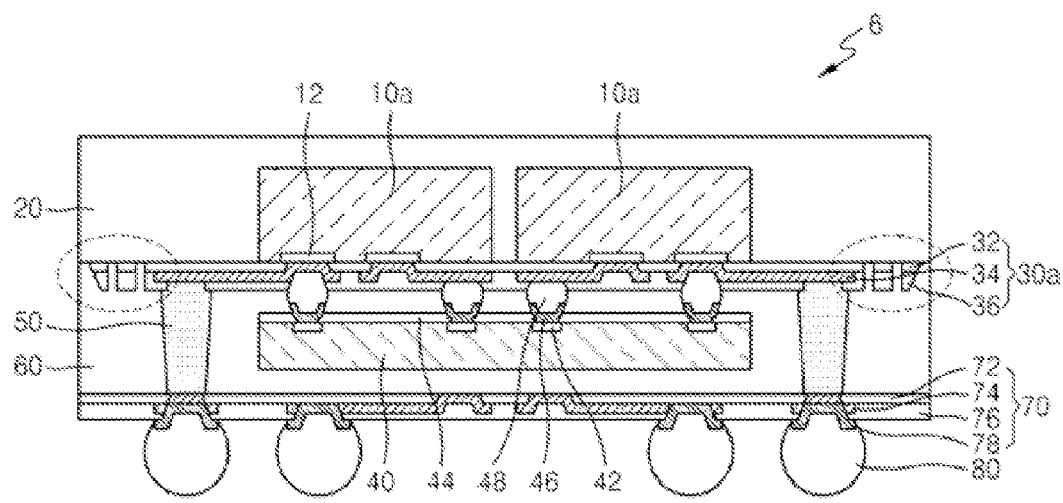

Referring to FIG. 6, the semiconductor package 6 may include a plurality of upper semiconductor chips 10a. The upper semiconductor chips 10a may be electrically connected to an embedded rewiring pattern layer 30a, similarly to the upper semiconductor chip 10 of FIG. 1. In addition, the upper encapsulation member 20 and the lower encapsulation member 60 may be connected to each other to encapsulate the embedded rewiring pattern layer 30a to prevent exposure thereof. In addition, the lower encapsulation member 60 may penetrate a portion of the embedded rewiring pattern layer 30a and thus is more closely connected to the upper encapsulation member 20. Accordingly, an adhesive strength between the upper and lower encapsulation members 20 and 60 may be further increased.

Figure 7:
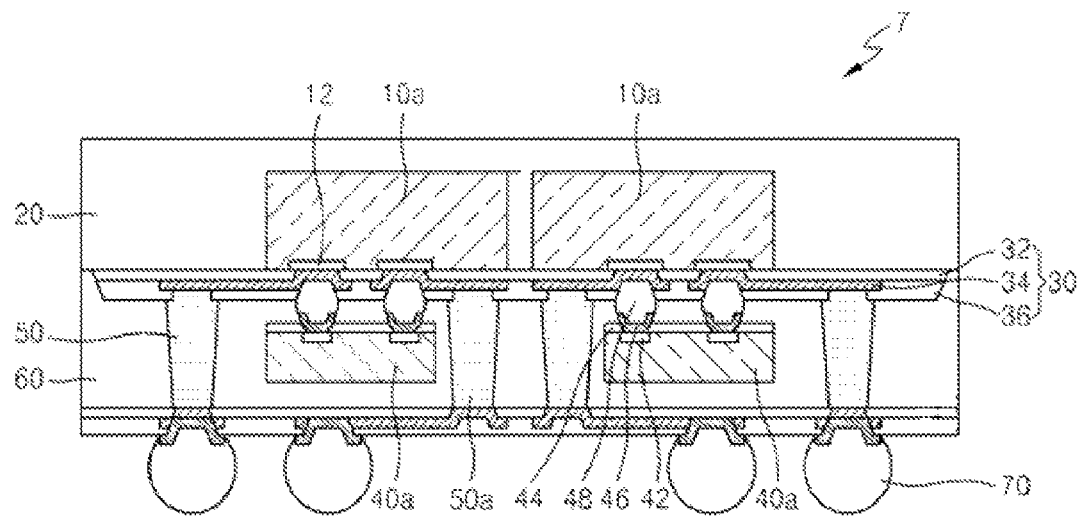

Referring to FIG. 7, the semiconductor package 7 may include a plurality of upper semiconductor chips 10a and a plurality of lower semiconductor chips 40a. The upper semiconductor chips 10a may be electrically connected to the embedded rewiring pattern layer 30, similarly to the upper semiconductor chip 10 of FIG. 1. The lower semiconductor chips 40a may be electrically connected to the embedded rewiring pattern layer 30, similarly to the lower semiconductor chip 40 of FIG. 1. Conductive posts 50a may be disposed between the lower semiconductor chips 40a, and the conductive posts 50a may be electrically connected to the embedded rewiring pattern layer 30.

Figure 8:
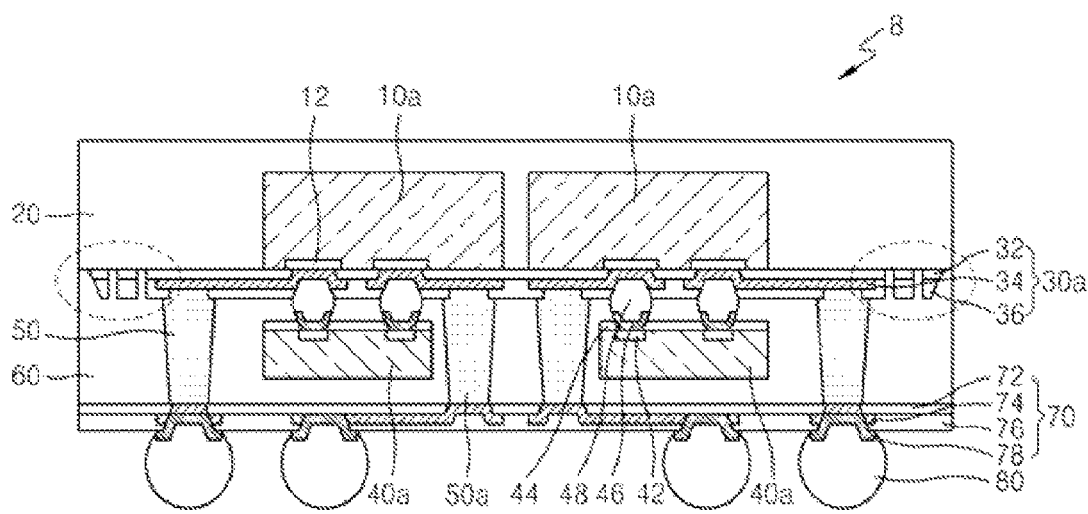

Referring to FIG. 8, the semiconductor package 8 may include a plurality of upper semiconductor chips 10a and a plurality of lower semiconductor chips 40a. The upper semiconductor chips 10a may be electrically connected to an embedded rewiring pattern layer 30a, similarly to the upper semiconductor chip 10 of FIG. 1. The lower semiconductor chips 40a may be electrically connected to the embedded rewiring pattern layer 30a, similarly to the lower semiconductor chip 40 of FIG. 1. Conductive posts 50a may be disposed between the lower semiconductor chips 40a, and the conductive posts 50a may be electrically connected to the embedded rewiring pattern layer 30a. In addition, the upper encapsulation member 20 and the lower encapsulation member 60 may be connected to each other to encapsulate the embedded rewiring pattern layer 30a to prevent exposure thereof. In addition, the lower encapsulation member 60 may penetrate a portion of the embedded rewiring pattern layer 30a and thus is more closely connected to the upper encapsulation member 20. Accordingly, an adhesive strength between the upper and lower encapsulation members 20 and 60 may be further increased.

FIGS. 9 through 18 are sectional views sequentially illustrating a method of manufacturing the semiconductor package 1 of FIG. 1, according to an embodiment of the present invention.

Figure 9:
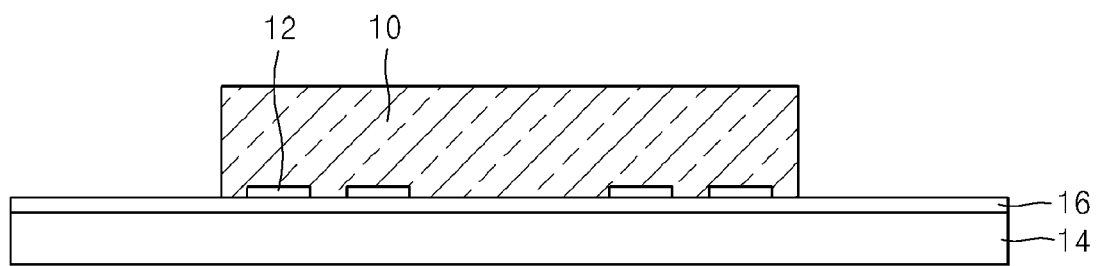
FIGS. 9 through 18 are sectional views sequentially illustrating a method of manufacturing the semiconductor package of FIG. 1, according to an embodiment of the present invention.

Referring to FIG. 9, the upper semiconductor chip 10 is attached to a first carrier substrate 14 using an adhesive member 16. The adhesive member 16 may be a liquid adhesive or an adhesive tape. Upper semiconductor chip pads 12 of the upper semiconductor chip 10 may be facing downwards and contact the adhesive member 16. The first carrier substrate 14 may include silicon, glass, ceramic, plastic, or a polymer.

Figure 10:
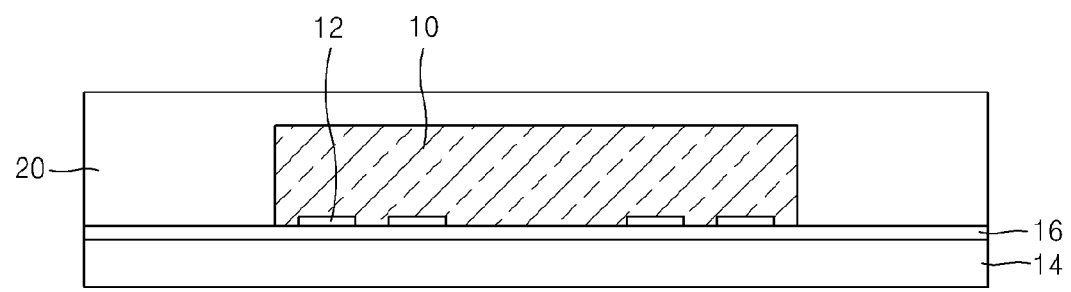

Referring to FIG. 10, the upper encapsulation member 20 is formed to encapsulate the upper semiconductor chip 10. The upper encapsulation member 20 may completely cover the upper semiconductor chip 10. The upper encapsulation member 20 may include an insulating material, for example, EMC.

Figure 11:
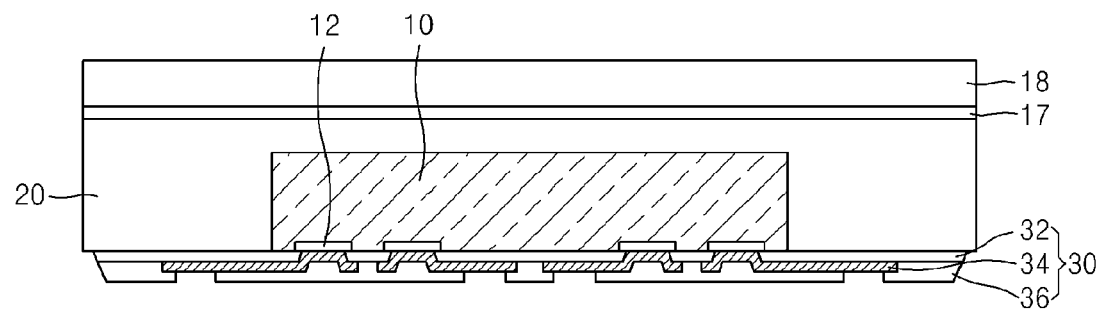

Referring to FIG. 11, a second carrier substrate 18 is attached to the upper encapsulation member 20 using an adhesive member 17. The adhesive member 17 may be a liquid adhesive or an adhesive tape. The second carrier substrate 18 may include silicon, glass, ceramic, plastic, or a polymer. Subsequently, the first carrier substrate 14 is removed to expose the upper semiconductor chip 10. Consequently, the upper semiconductor chip pads 12 are exposed.

Figure 12:
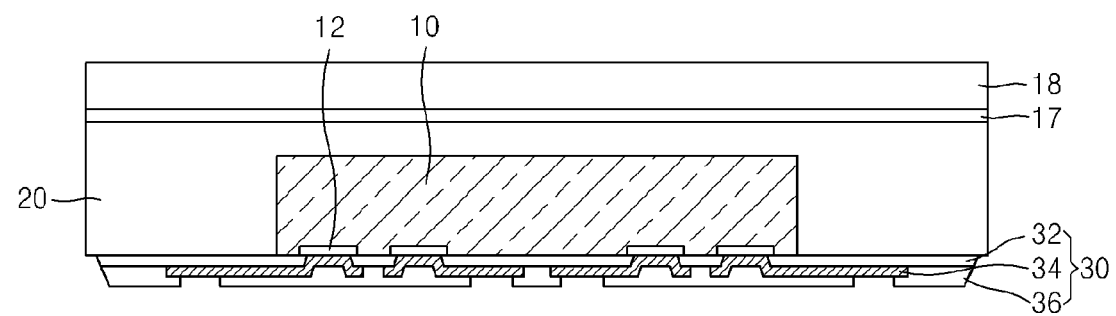

Referring to FIG. 12, the embedded rewiring pattern layer 30 is formed on the exposed upper semiconductor chip 10 and upper encapsulation member 20. The embedded rewiring pattern layer 30 may include the first insulating layer 32, the rewiring patterns 34, and the second insulating layer 36. For example, the first insulating layer 32 is formed on the upper semiconductor chip 10, and the first insulating layer 32 is partially removed to expose the upper semiconductor chip pads 12. Thereafter, the rewiring patterns 34, electrically connected to the exposed upper semiconductor chip pads 12 and extending on an upper surface of the first insulating layer 32, are formed. The rewiring patterns 34 may be formed using various methods such as deposition, plating, or the like. The second insulating layer 36 is formed on the rewiring patterns 34 and partially removed to partially expose the rewiring patterns 34. In the subsequent manufacturing processes, the conductive posts 50 (see FIG. 13) or the connection members 48 (see FIG. 14) may be attached to the exposed rewiring patterns 34.

In addition, a previously manufactured substrate may be used as the embedded rewiring pattern layer 30. In some embodiments, the embedded rewiring pattern layer 30 may be adhered to the upper semiconductor chip 10 and the upper encapsulation member 20 by pressing, adhesion, or a reflow process.

Figure 13:
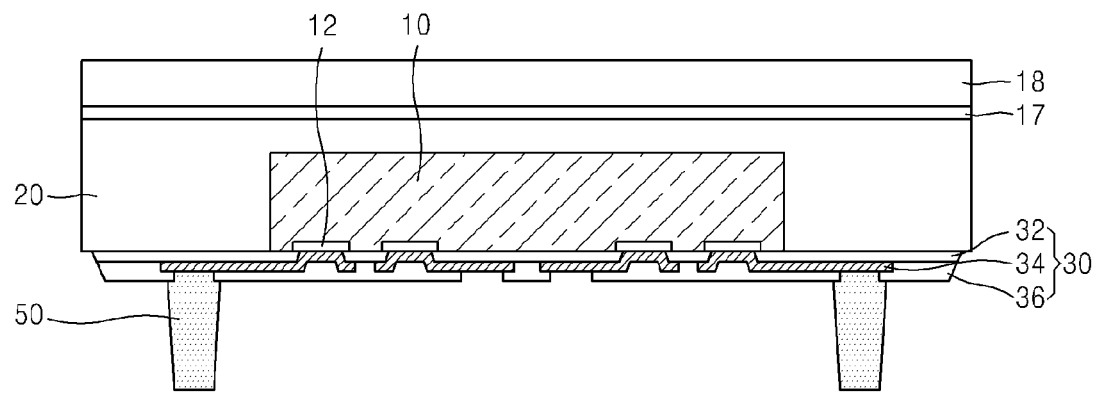

Referring to FIG. 13, the conductive posts 50 are formed to be electrically connected to the embedded rewiring pattern layer 30. The conductive posts 50 may be disposed on exposed portions of the embedded rewiring pattern layer 30 and be electrically connected thereto. The conductive posts 50 may include a conductive material, for example, a metal such as Cu, a Cu alloy, Al, an Al alloy. Also, the conductive posts 50 may include conductive solder or a solder paste including a conductive material. Although not illustrated in FIG. 13, the conductive posts 50 may be formed by forming a mask layer on the embedded rewiring pattern layer 30, forming openings in the mask layer to partially expose the embedded rewiring pattern layer 30, filling the openings with a conductive material, and removing the mask layer. The mask layer may include, for example, photoresist.

Figure 14:
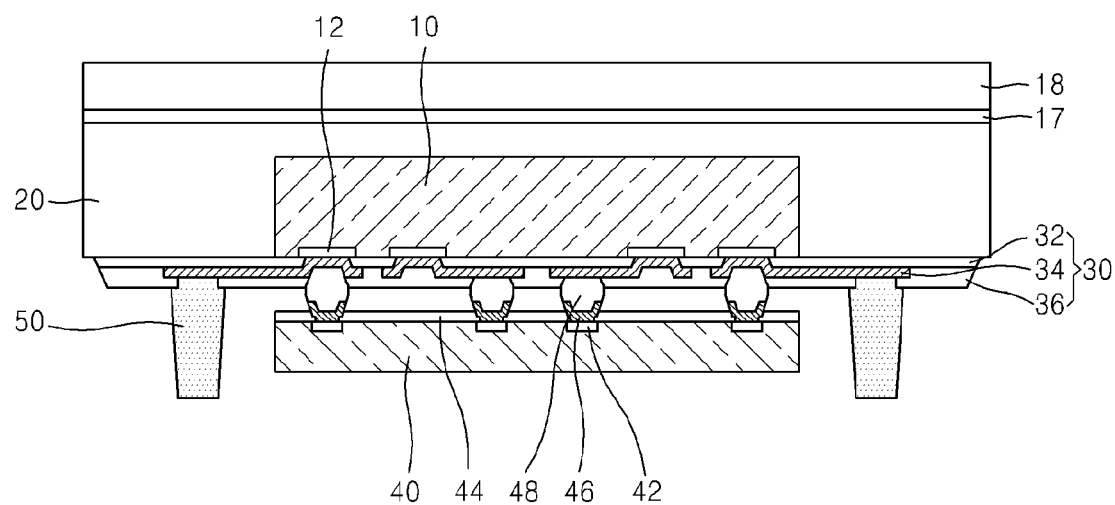

Referring to FIG. 14, the lower semiconductor chip 40 is attached below the embedded rewiring pattern layer 30 in a position opposite to the upper semiconductor chip 10. The lower semiconductor chip 40 may include the insulating layer 44 to expose the lower semiconductor chip pads 42 and the bonding pads 46 on the respective lower semiconductor chip pads 42. The connection members 48 are disposed between the bonding pads 46 and exposed portions of the rewiring patterns 34 of the embedded rewiring pattern layer 30. The connection members 48 may electrically connect the lower semiconductor chip 40 to the embedded rewiring pattern layer 30. In addition, the upper and lower semiconductor chips 10 and 40 may be electrically connected to each other via the embedded rewiring pattern layer 30 and the connection members 48. The connection members 48 may include a conductive material, e.g., a metal. The connection members 48 may be, for example, solder balls and may be attached to the bonding pads 46 and the embedded rewiring pattern layer 30 through a reflow process. The height of the conductive posts 50 from the embedded rewiring pattern layer 30 may be greater than that of the lower semiconductor chip 40.

Alternatively, the manufacturing process illustrated in FIG. 13 and the manufacturing process illustrated in FIG. 14 may be performed in reverse order.

Figure 15:
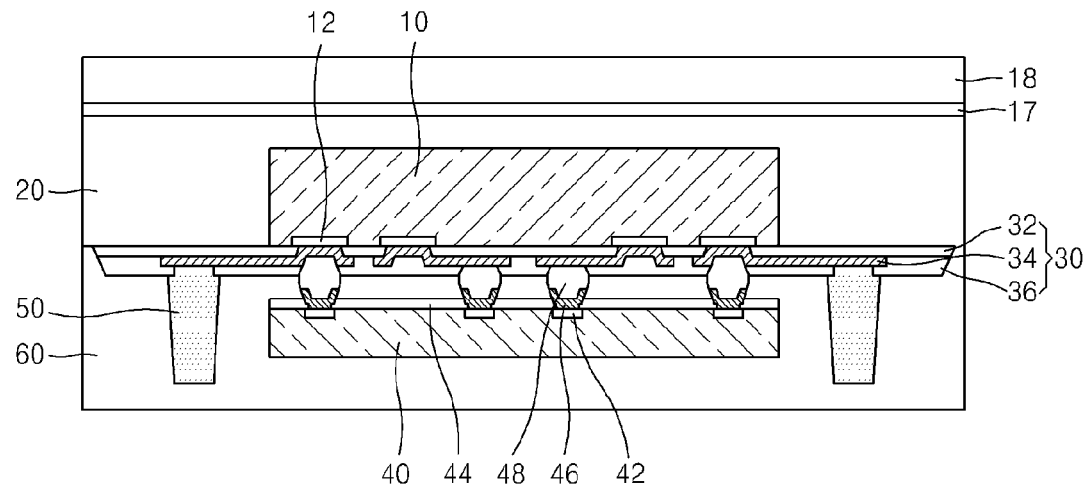

Referring to FIG. 15, the lower encapsulation member 60 is formed to encapsulate the lower semiconductor chip 40 and the conductive posts 50. The lower encapsulation member 60 may encapsulate the lower semiconductor chip 40 to prevent exposure thereof. In addition, the lower encapsulation member 60 may encapsulate the embedded rewiring pattern layer 30. The lower encapsulation member 60 may fill a space between the connection members 48 of the lower semiconductor chip 40. The lower encapsulation member 60 may include an insulating material, for example, EMC.

The upper and lower encapsulation members 20 and 60 may be connected to each other and encapsulate the embedded rewiring pattern layer 30 to prevent exposure thereof. Alternatively, the embedded rewiring pattern layer 30 may be exposed via the upper encapsulation member 20 and/or the lower encapsulation member 60. The upper and lower encapsulation members 20 and 60 may include the same material or different materials. The upper and lower encapsulation members 20 and 60 may form a unibody structure.

Alternatively, a through electrode such as TSV may be used instead of the conductive posts 50. That is, in FIG. 12, the conductive posts 50 may be formed by forming the lower encapsulation member 60 on the embedded rewiring pattern layer 30, partially removing the lower encapsulation member 60 to form openings to expose the rewiring patterns 34 of the embedded rewiring pattern layer 30, and filling the openings with a conductive material.

Figure 16:
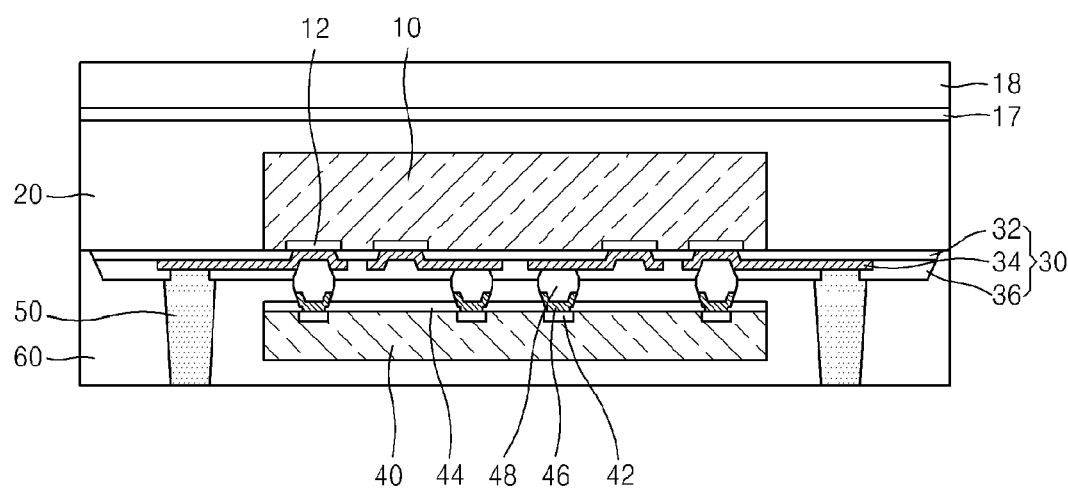

Referring to FIG. 16, the lower encapsulation member 60 may be planarized by polishing, an etch-back process, or chemical mechanical polishing (CMP) to thus expose the conductive posts 50. As described above, the height of the conductive posts 50 from the embedded rewiring pattern layer 30 may be greater than that of the lower semiconductor chip 40, and thus the lower semiconductor chip 40 may be embedded so as not to be exposed via the lower encapsulation member 60.

Figure 17:
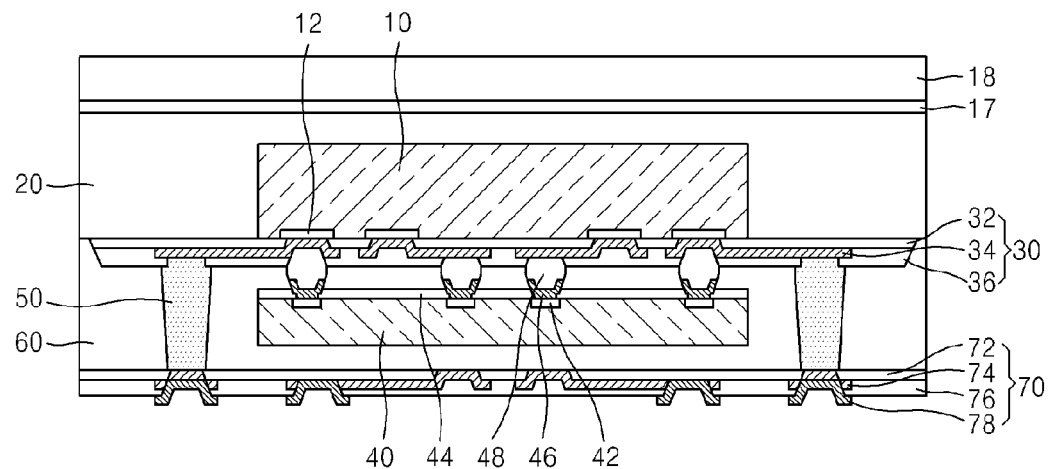

Referring to FIG. 17, the external rewiring pattern layer 70 is formed on a lower surface of the lower encapsulation member 60 and electrically connected to the conductive posts 50. The external rewiring pattern layer 70 may include the third insulating layer 72, the external rewiring patterns 74, the fourth insulating layer 76, and the external bonding pads 78. For example, the third insulating layer 72 is formed on the lower encapsulation member 60 and is partially removed to expose the conductive posts 50. Subsequently, the external rewiring patterns 74 are formed to be electrically connected to the exposed conductive posts 50 and to extend on the third insulating layer 72. The external rewiring patterns 74 may be formed using various methods, such as deposition, plating, or the like. The fourth insulating layer 76 is formed on the external rewiring patterns 74 and partially removed to partially expose the external rewiring patterns 74. In the subsequent manufacturing process, the external connection members 80 (see FIG. 18) may be attached to the exposed portions of the external rewiring patterns 74. Optionally, the external bonding pads 78 may be further formed on the exposed portions of the external rewiring patterns 74.

Also, a previously manufactured substrate may be used as the external rewiring pattern layer 70. In some embodiments, the external rewiring pattern layer 70 may be adhered to the conductive posts 50 and the lower encapsulation member 60 by pressing, adhesion, or a reflow process.

Figure 18:
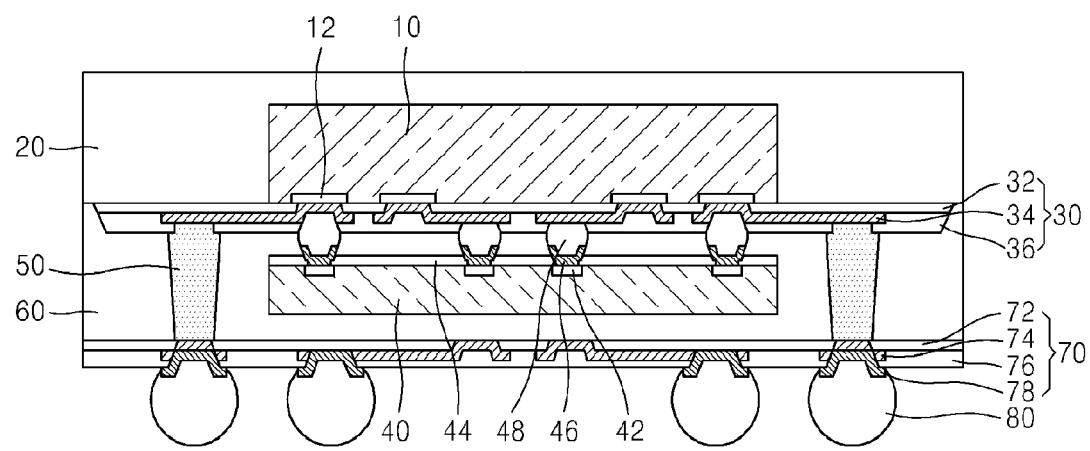

Referring to FIG. 18, the external connection members 80 are attached to the external rewiring pattern layer 70 to be electrically connected thereto. The external connection members 80 may be attached to the exposed external rewiring patterns 74 or the external bonding pads 78. The external connection members 80 may include a conductive material, e.g., a metal. The external connection members 80 may be solder balls.

Next, the second carrier substrate 18 is removed, thereby completing manufacture of the semiconductor package 1 of FIG. 1.

As is apparent from the above description, a semiconductor package includes semiconductor chips mounted at upper and lower sides of an embedded rewiring pattern layer, at least one of which is embedded in an encapsulation member, and an external rewiring pattern layer formed on the encapsulation member, whereby the sizes of the semiconductor chips are not limited, input and output terminals may be miniaturized, and the number of the input and output terminals may be increased.

Rear and side surfaces of the semiconductor package are completely covered by the encapsulation member, and thus may be protected from external impacts. The encapsulation member is formed to penetrate the embedded rewiring pattern layer, whereby an adhesive strength of the encapsulation member may be improved.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor package comprising:
    an embedded rewiring pattern layer, wherein the embedded rewiring pattern layer includes a first insulating layer, a second insulating layer and rewiring patterns formed between the first insulating layer and the second insulating layer wherein upper surfaces of the rewiring patterns are partially exposed through the first insulating layer and lower surfaces of the rewiring patterns are partially exposed through the second insulating layer;
    an upper semiconductor chip disposed above the embedded rewiring pattern layer, wherein the upper semiconductor chip includes at least one upper semiconductor chip pad that is disposed on a bottom surface of the upper semiconductor chip and directly electrically connected to a respective partially exposed upper surface of the rewiring patterns;
    an upper encapsulation member encapsulating the upper semiconductor chip;
    a lower semiconductor chip disposed below the embedded rewiring pattern layer, wherein the lower semiconductor chip includes at least one lower semiconductor chip pad that is disposed on a top surface of the lower semiconductor chip and electrically connected to a respective partially exposed lower surface of the rewiring patterns via a connection member disposed on the lower semiconductor chip pad, wherein the upper semiconductor chip and the lower semiconductor chip are rewired by the rewiring patterns and are electrically connected to external connection members;

a lower encapsulation member encapsulating the lower semiconductor chip to prevent exposure thereof;

a plurality of conductive posts electrically connected to lower surfaces of the embedded rewiring pattern layer and disposed into the lower encapsulation member; and an external rewiring pattern layer formed on a lower surface of the lower encapsulation member, wherein the external rewiring pattern layer is formed apart from the lower semiconductor and electrically connects the conductive post to the external connection members, wherein the external connection members electrically connected to the conductive post, wherein the upper encapsulation member and the lower encapsulation member are connected to each other to encapsulate the embedded rewiring pattern layer to prevent exposure thereof, wherein the lower encapsulation member encapsulates a gap between lower surfaces of the embedded rewiring pattern layer and upper surfaces of the lower semiconductor chip and encapsulates a gap between upper surfaces of the external rewiring pattern layer and the lower semiconductor chip and surrounds the connection member, and wherein the plurality of conductive posts are electrically connected to the embedded rewiring pattern layer and the external rewiring pattern layer and are embedded by the lower encapsulation member.

2. The semiconductor package according to claim 1, wherein some of the external connection members are disposed below the lower semiconductor chip.

3. The semiconductor package according to claim 1, wherein the embedded rewiring pattern layer includes holes connecting the upper encapsulation member and the lower encapsulation member, and wherein the lower encapsulation member is connected to the upper encapsulation member via the holes.

4. The semiconductor package according to claim 1, wherein the upper semiconductor chip and the lower semiconductor chip are electrically connected to each other via the embedded rewiring pattern layer.

5. The semiconductor package according to claim 1, wherein the lower semiconductor chip comprises a plurality of lower semiconductor chips.

6. The semiconductor package according to claim 5, wherein the plurality of conductive posts comprise some conductive posts disposed between the plurality of lower semiconductor chips.

7. The semiconductor package according to claim 1, wherein the upper semiconductor chip comprises a plurality of upper semiconductor chips.

8. The semiconductor package according to claim 1, wherein the upper and lower semiconductor chips have the same size.

9. The semiconductor package according to claim 1, wherein the conductive post is disposed on an exposed portion of the embedded rewiring pattern layer.

10. The semiconductor package according to claim 1, wherein the conductive post is disposed at a side of the lower semiconductor chip.

11. The semiconductor package according to claim 1, wherein a height of the conductive post, measured from the embedded rewiring pattern layer to a lower surface of the lower encapsulation member, is greater than a height of the lower semiconductor chip.

12. The semiconductor package according to claim 1, wherein the conductive post is only disposed in the lower encapsulation member.

* * * * *